(12) United States Patent
Kawada et al.

(10) Patent No.: US 6,806,164 B2
(45) Date of Patent: Oct. 19, 2004

(54) SEMICONDUCTOR APPARATUS AND METHOD FOR FABRICATING THE SAME

(75) Inventors: Shinzi Kawada, Miyagi (JP); Hiroyuki Kawano, Miyagaki (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 128 days.

(21) Appl. No.: 10/175,863

(22) Filed: Jun. 21, 2002

(65) Prior Publication Data

US 2002/0160615 A1 Oct. 31, 2002

Related U.S. Application Data

(62) Division of application No. 09/864,201, filed on May 25, 2001, now Pat. No. 6,444,540.

(30) Foreign Application Priority Data

May 31, 2000 (JP) .......................... 2000-161928

(51) Int. Cl.[7] .............................................. H01L 21/76
(52) U.S. Cl. .................... 438/424; 438/425; 438/426; 438/700; 438/701; 438/706; 438/717; 438/718; 438/719
(58) Field of Search ................................ 438/424, 425, 438/426, 700, 701, 706, 717, 718, 719

(56) References Cited

U.S. PATENT DOCUMENTS 5,940,716 A * 8/1999 Jin et al. ................ 438/424
5,963,819 A * 10/1999 Lan ........................ 438/424
5,994,229 A 11/1999 Chen et al.
6,057,241 A 5/2000 Matsuda et al.
6,121,113 A * 9/2000 Takatsuka et al. .......... 438/424
6,150,234 A * 11/2000 Olsen ...................... 438/424
6,180,533 B1 1/2001 Jain et al.
6,218,309 B1 4/2001 Miller et al.
6,391,729 B1 * 5/2002 Hui ........................ 438/298

FOREIGN PATENT DOCUMENTS

| JP | 09-283614 | 10/1997 |
|----|-----------|---------|
| JP | 11-135609 | 5/1999 |
| JP | 11-233617 | 8/1999 |

OTHER PUBLICATIONS

Ding, U.S. patent application Publication 2002/0045324, Apr. 18, 2002.*

Abstract of WO 00/14797; Mar. 16, 2000.

* cited by examiner

Primary Examiner—David A. Zarneke
(74) Attorney, Agent, or Firm—Volentine Francos, PLLC

(57) ABSTRACT

First, a substrate, on which a plurality of semiconductor devices is formed, is provided. Next, a first etching treatment is carried out to the substrate with a first etching gas comprising $CF_4$ to form a base trench having a rounded-off upper edge or tapered upper edge. A second etching treatment is carried out to the substrate to form a trench region at the base trench so that the trench region has a rounded-off upper edge. And then, an insulating layer is formed on the substrate to fill up the trench region therewith.

4 Claims, 14 Drawing Sheets

SEMICONDUCTOR APPARATUS AND METHOD FOR FABRICATING THE SAME

CROSS REFERENCE TO RELATED APPLICATIONS

This is a divisional application of application Ser. No. 09/864,201, filed May 25, 2001, now U.S. Pat. No. 6,444,540, which is hereby incorporated by reference in its entirety for all purposes.

TECHNICAL FIELD OF THE INVENTION

The present invention relates to a semiconductor apparatus, and more particularly to a method for fabricating a semiconductor apparatus having a trench region for isolating semiconductor devices in the apparatus.

BACKGROUND OF THE INVENTION

For isolating semiconductor devices in a semiconductor apparatus, trench isolation technique has been used. According to a conventional method, an SiN layer is formed on a semiconductor substrate; then trench regions are formed by etching using the SiN layer as a mask. After that, an oxide layer is provided in the trench regions by a CVD process; and then, the oxide layer is removed by a CMP process.

According to such a conventional method, sharp corners of the trench regions may be exposed when the SiN layer is removed. As a result, characteristics of semiconductor devices may be changed, and electric field is concentrated at the exposed corners of the trench regions.

OBJECTS OF THE INVENTION

Accordingly, an object of the present invention is to provide a semiconductor apparatus in which a trench region is fabricated to have an upper edge or upper corner which is not exposed.

Another object of the present invention is to provide a semiconductor apparatus in which a trench region is fabricated not to have sharp upper edge or upper corner.

Additional objects, advantages and novel features of the present invention will be set forth in part in the description that follows, and in part will become apparent to those skilled in the art upon examination of the following or may be learned by practice of the invention. The objects and advantages of the invention may be realized and attained by means of the instrumentalities and combinations particularly pointed out in the appended claims.

SUMMARY OF THE INVENTION

According to a first aspect of the present invention, a semiconductor apparatus includes a substrate on which a plurality of semiconductor devices are formed; a mask layer formed on the substrate to have an opening which corresponds to a device isolating region; a trench region formed by etching the substrate using the mask layer as an etching mask; and an insulating layer filled in the trench region so that an upper edge or upper corner of the trench region is not exposed.

The upper edge of the trench region may be rounded-off. The mask layer may be formed so that the opening is expanded outwardly to cover the upper edge of the trench region completely.

According to a second aspect of the present invention, a method includes the steps of: providing a substrate on which a plurality of semiconductor devices are formed; performing a first etching treatment to the substrate with a first etching gas comprising $CF_4$ to form a base trench having a rounded-off upper edge or tapered upper edge; performing a second etching treatment to the substrate to form a trench region at the base trench so that the trench region has a rounded-off upper edge; and forming an insulating layer on the substrate to fill up the trench region therewith.

The first etching gas may include HBr. Preferably, the ratio of flow rate of HBr and $CF_4$ is between 1:2 and 1:5.

The first etching gas may further include $CH_2F_2$. Preferably, the ratio of flow rate of $CF_4$ and $CH_2F_2$ is between 2:1 and 3:1. Further, the upper edge of the trench region may be rounded off before forming the insulating layer.

According to a third aspect of the present invention, a method includes the steps of: providing a substrate on which a plurality of semiconductor devices are formed; providing a mask layer on the substrate to have an opening corresponding to a device isolating region; performing a first etching treatment to the substrate using the mask layer as an etching mask to form a trench region on the substrate; enlarging the opening of the mask layer so that an upper edge of the trench region are fully exposed; and providing an insulating layer on the substrate so that the insulating layer extends outwardly from the trench region to cover the upper edge of the trench region completely.

Preferably, the opening of the mask layer is enlarged in the range of 300 Å to 500 Å in a horizontal direction on the substrate. The opening of the mask layer may be enlarged by an isotropic etching process.

Further, a thermal oxidation treatment may be carried out to the substrate after enlarging the opening of the mask layer so that the upper edge of the trench region is rounded off.

A second etching treatment may be carried out to the substrate after the opening of the mask layer is enlarged so that the upper edge of the trench region is tapered. In this case, preferably, a thermal oxidation treatment is carried out to the substrate after the second etching treatment so that the tapered upper edge of the trench region is rounded off.

The upper edge of the trench region may be rounded off before enlarging the opening of the mask layer.

DETAILED DISCLOSURE OF THE INVENTION

In the following detailed description of the preferred embodiments, reference is made to the accompanying drawings which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present inventions. The following detailed description is, therefore, not to be taken in a limiting sense, and scope of the present inventions is defined only by the appended claims.

Figure 1:
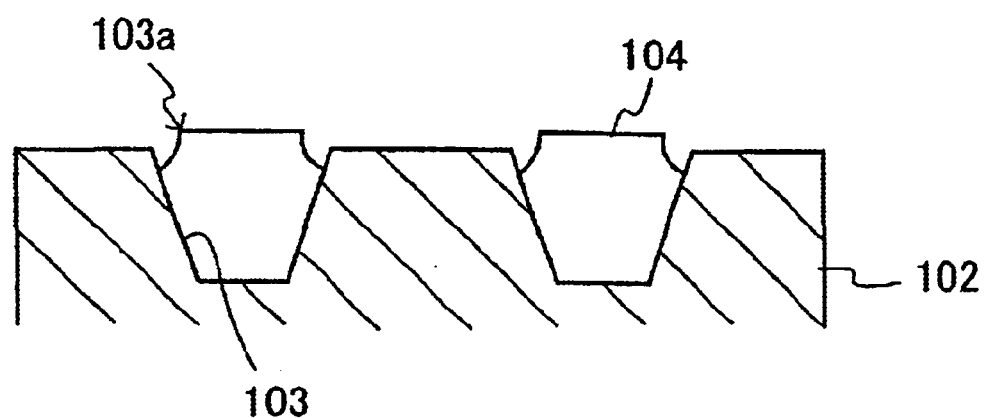
FIG. 1 is a cross-sectional view showing a part of a conventional semiconductor apparatus.

For better understanding of the present invention, a conventional technology is first described in conjunction with FIG. 1. According to a conventional method, an SiN layer (not shown) is formed on a semiconductor substrate 102; then trench regions 103 are formed by etching using the SiN layer as a mask. After that, an oxide layer 104 is provided in the trench regions 103 by a CVD process; and then, an upper portion of the oxide layer 104 is removed by a CMP process.

According to such a conventional method, sharp corners 103a of the trench regions 103 may be exposed when the SIN layer is removed. As a result, characteristics of semiconductor devices may be changed, and electric field is concentrated at the exposed corners 103a of the trench regions 103.

First Preferred Embodiment

FIGS. 2A to 2G are cross-sectional views showing the fabrication steps according to a first preferred embodiment of the present invention.

Figure 2A:
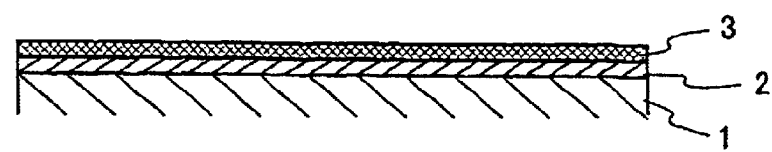
FIGS. 2A to 2G are cross-sectional views showing the fabrication steps according to a first preferred embodiment of the present invention.

First, referring to FIG. 2A, a PAD oxide layer 2 is formed on the semiconductor substrate 1 by a CVD process to have a thickness of about 200 Å. Next, an SiN layer 3 is formed on the PAD oxide layer 2 by a CVD process to have a thickness of about 500 Å to 5000 Å.

Figure 2B:
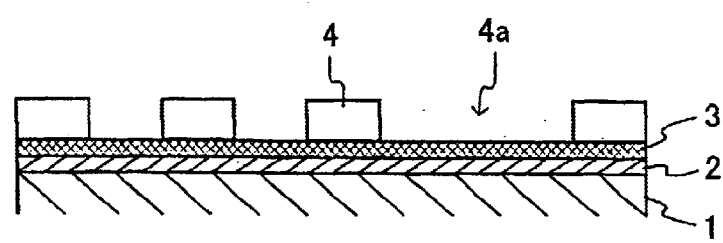

Subsequently, a resist layer is formed on the SiN layer 3 and is patterned to have openings 4a corresponding to device isolating regions, as shown in FIG. 2B.

Figure 2C:
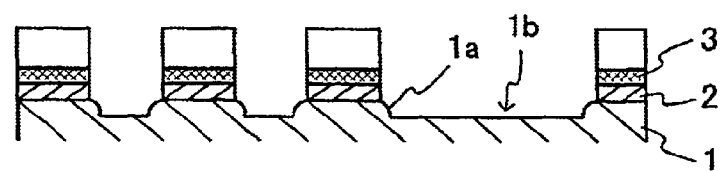

Now referring to FIG. 2C, the PAD oxide layer 2 and SiN layer 3 are plasma-etched with an etching gas including HBr and $CF_4$ using the resist pattern 4 as an etching mask to form trench bases 1b, at which trench regions 5 are to be formed. The etching process used in this embodiment is ICP (Inductively Coupled Plasma) type of etching. In this embodiment first and second etching processes are carried out to form the trench regions 5 in the substrate 1. A first etching is carried out under the following conditions:

(1) Gas Flow Rate: $HBr/CF_4$=20/80 sccm
(2) Electric Power to Upper Electrode/Lower Electrode: 700 W/150 W
(3) Pressure: 15 mTorr
(4) Etching Time: 10 sec According to the first etching process, the trench bases 1b with rounded-off edges 1a are formed in the substrate 1. $CF_4$ is included in the etching gas, so that no sharp corners or upper edges are formed but the rounded-off edges 1a are formed. It can be considered that a reaction product including fluorine is formed on inner side surfaces of the SiN layer 3, and therefore, the etching speed is lowered around inside surface of the trench bases 1b. In contrast, according to a conventional method using an etching gas not including $CF_4$, trench regions are formed to have sharp corners of edges.

Figure 2D:
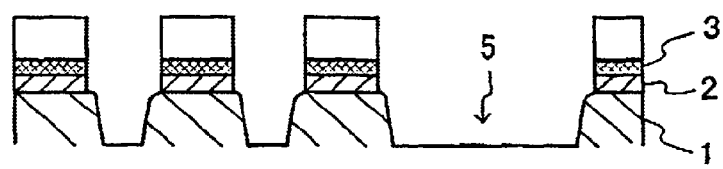
Figure 3A:
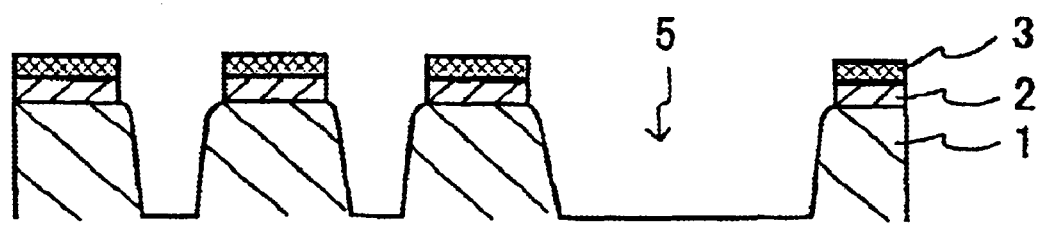
FIGS. 3A and 3B are cross-sectional view used for showing shapes of a semiconductor substrate treated in the different ways.
Figure 3B:

Shapes of the rounded-off edges 1b are different depending on the ratio of HBr and CF4 in the etching gas. FIG. 3A shows a trench region 5 formed by an etching process using an etching gas including HBr and $CF_4$ at the ration of 4:1. FIG. 3B shows a trench region 5 formed by an etching process using an etching gas including HBr and $CF_4$ at the ration of 1:4. The following is preferable condition for the first etching:

(1) Ratio of $HBr:CF_4$=1:2 to 1:5
(2) Electric Power to Upper Electrode: 500 W or higher
(3) Pressure: 10 to 30 mTorr
(4) Etching Time: 10 to 20 sec After first etching process, a second etching process is carried out with an etching gas excluding $CF_4$ to form the trench regions 5 in the substrate 1, as shown in FIG. 2D. The second etching process is carried out under the following condition:

(1) Gas Flow Rate: $HBr/O_2$=90/5 sccm
(2) Electric Power to Upper Electrode/Lower Electrode: 600 W/66 W
(3) Pressure: 5 mTorr
(4) Etching Time: 85 sec The first and second etching processes are carried out continuously using the same etching chamber. The trench regions 5 are formed to have a depth of about 2500 Å to 5000 Å. Each of the trench regions 5 is shaped to have a narrower bottom and wider top. Shaping the trench regions in that way makes an oxide 6 layer go into the bottom of the trench region 5 easily. The first and second etching processes can be carried out only using the SiN layer 3 as an etching mask after removing the resist pattern 4. However, in view of simplicity of fabrication steps and deformation of the SiN layer 3, both of the resist layer 4 and SiN layer 3 are preferably used as an etching mask.

Figure 2E:
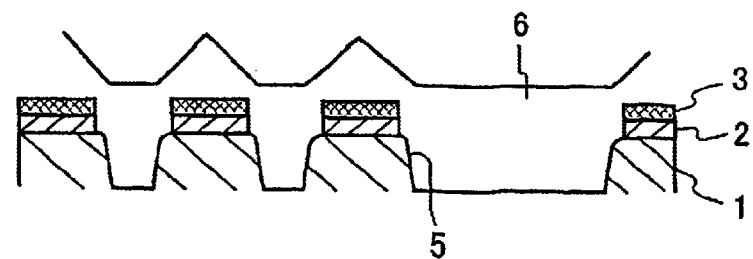

Next, as shown in FIG. 2E, an embedded oxide layer 6 is formed over the entire surface of the substrate 1 by a CVD process using high-density plasma. The trench regions 5 are filled up with the oxide layer 6.

Figure 2F:
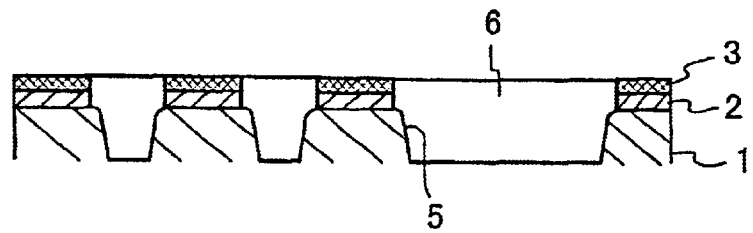
Figure 2G:
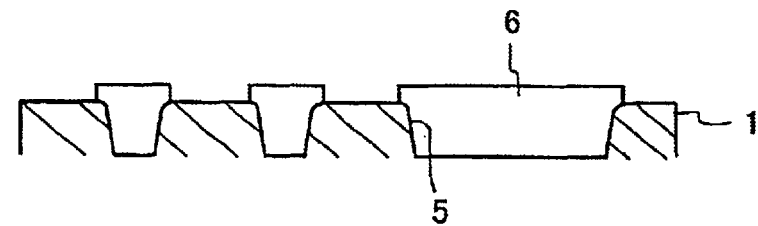

Subsequently, the oxide layer 6 is polished by a CMP process to the surface level of the SiN layer 3, as shown in FIG. 2F. After that, the SiN layer 3 and PAD oxide layer 2 are removed to form device isolating regions, as shown in FIG. 2G.

As described above, according to the first preferred embodiment of the present invention, the trench regions 5 are formed to have rounded-shaped upper edges, so that concentration of electric field at upper edges of the trench regions can be prevented and characteristics of semiconductor devices becomes stable and reliable.

Second Preferred Embodiment

FIGS. 4A to 4H are cross-sectional views showing the fabrication steps according to a second preferred embodiment of the present invention. In this embodiment, the same and corresponding components to those in the first preferred embodiment will be represented by the same reference numerals.

Figure 4A:
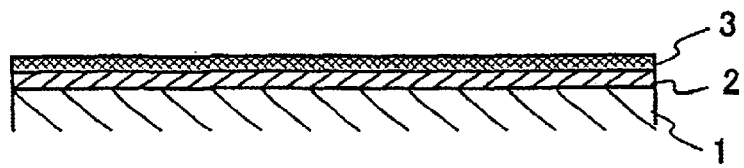
FIGS. 4A to 4H are cross-sectional views showing the fabrication steps according to a second preferred embodiment of the present invention.

First, referring to FIG. 4A, a PAD oxide layer 2 is formed on the semiconductor substrate 1 by a CVD process to have a thickness of about 200 Å. Next, an SiN layer 3 is formed on the PAD oxide layer 2 by a CVD process to have a thickness of about 500 Å to 5000 Å.

Figure 4B:
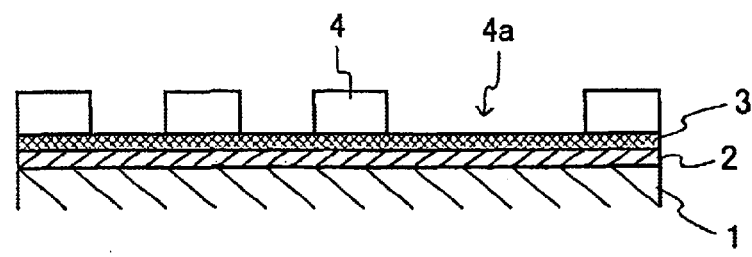

Subsequently, a resist layer is formed on the SiN layer 3 and is patterned to have openings 4a corresponding to device isolating regions, as shown in FIG. 4B.

Figure 4C:
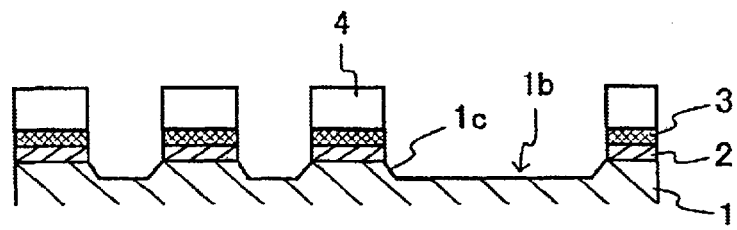

Now referring to FIG. 4C, the PAD oxide layer 2 and SiN layer 3 are plasma-etched with an etching gas including HBr, $CF_4$ and $CH_2F_2$ using the resist pattern 4 as an etching mask to form trench bases 1b, at which trench regions 5 are to be formed. The etching process used in this embodiment is ICP (Inductively Coupled Plasma) type of etching. In this embodiment first and second etching processes are carried out to form the trench regions 5 in the substrate 1. A first etching is carried out under the following conditions:

(1) Gas Flow Rate: $HBr/CF_4/CH_2F_2$=20/60/20 sccm
(2) Electric Power to Upper Electrode: 400 W
(3) Pressure: 15 mTorr
(4) Etching Time: 10 sec According to the first etching process, the trench bases 1b with tapered edges 1c are formed in the substrate 1. The tapered corners 1c are formed when the etching gas includes $CF_4$ and $CH_2F_2$ at a rate of 2:1 to 3:1.

Figure 4D:
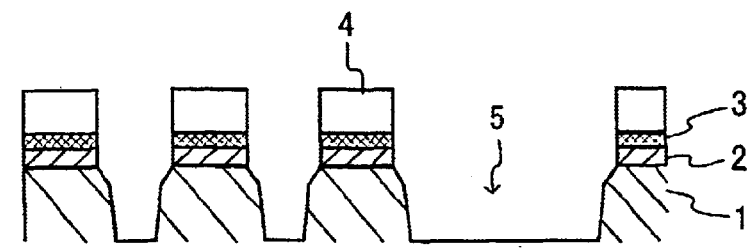

After first etching process, a second etching process is carried out with an etching gas excluding $CF_4$ to form the trench regions 5 in the substrate 1, as shown in FIG. 4D. The second etching process is carried out under the following condition:

(1) Gas Flow Rate: $HBr/O_2$=90/5 sccm
(2) Electric Power to Upper Electrode/Lower Electrode: 600 W/66 W
(3) Pressure: 5 mTorr
(4) Etching Time: 85 sec The first and second etching processes are carried out continuously using the same etching chamber.

Figure 4E:
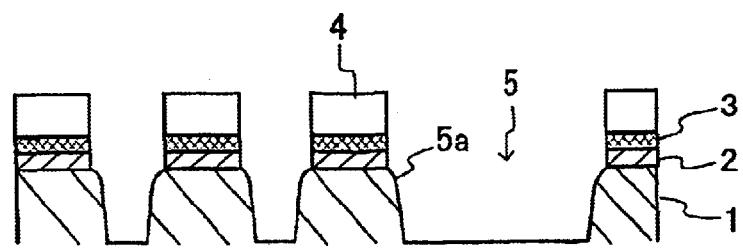

After the second etching process, a thermal oxidation process is carried out to the substrate 1 at a temperature of 1050° C. to 1100° C. to round off upper corners 5a of the trench regions 5, as shown in FIG. 4E.

The trench regions 5 are formed to have a depth of about 2500 Å to 5000 Å. Each of the trench regions 5 is shaped to have a wider bottom and narrower top. Shaping the trench regions in that way makes an oxide 6 layer go into the bottom of the trench region 5 easily. The first and second etching processes can be carried out only using the SiN layer 3 as an etching mask after removing the resist pattern 4. However, in view of simplicity of fabrication steps and deformation of the SiN layer 3, both of the resist layer 4 and SiN layer 3 are preferably used as an etching mask.

Figure 4F:
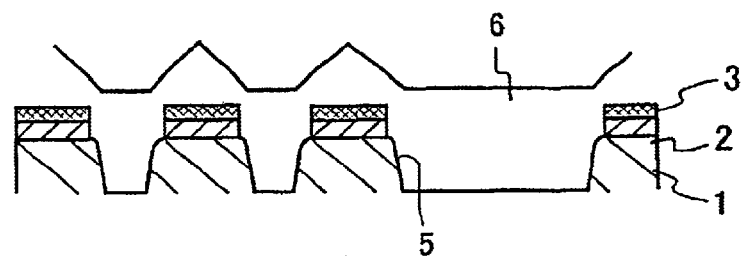

Next, as shown in FIG. 4F, an embedded oxide layer 6 is formed over the entire surface of the substrate 1 by a CVD process using high-density plasma. The trench regions 5 are filled up with the oxide layer 6.

Figure 4G:
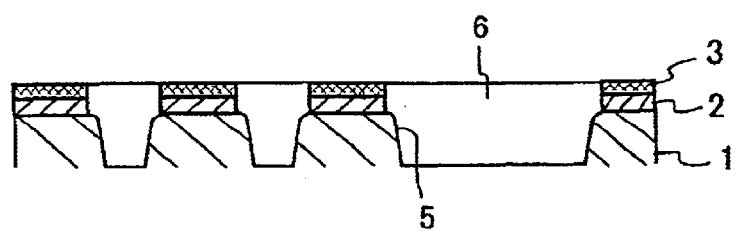
Figure 4H:
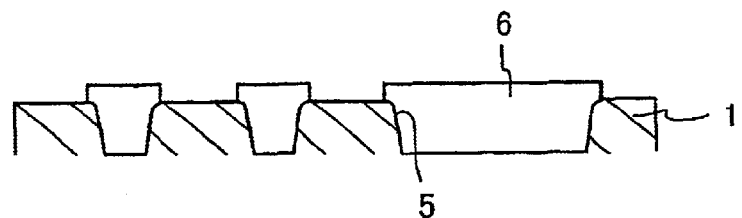

Subsequently, the oxide layer 6 is polished by a CMP process to the surface level of the SiN layer 3, as shown in FIG. 4G. After that, the SiN layer 3 and PAD oxide layer 2 are removed to form device isolating regions, as shown in FIG. 4H.

As described above, according to the second preferred embodiment of the present invention, $CH_2F_2$ gas is used in the first etching process, so that the tapered corners 1b are reliably formed with the trench regions 5. Further, the tapered corners 1b are rounded-off, and therefore, concentration of electric field at upper edges of the trench regions 5 can be prevented and characteristics of semiconductor devices becomes stable and reliable.

Third Preferred Embodiment

FIGS. 5A to 5G are cross-sectional views showing the fabrication steps according to a third preferred embodiment of the present invention. In this embodiment, the same and corresponding components to those in the above-described embodiments will be represented by the same reference numerals.

Figure 5A:
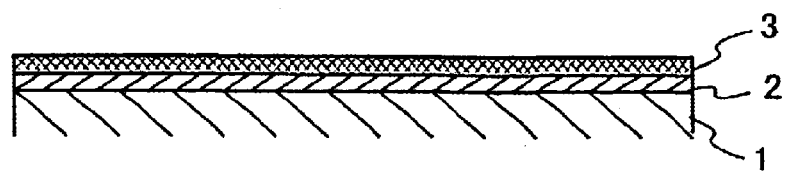
FIGS. 5A to 5G are cross-sectional views showing the fabrication steps according to a third preferred embodiment of the present invention.

First, referring to FIG. 5A, a PAD oxide layer 2 is formed on the semiconductor substrate 1 by a CVD process to have a thickness of about 200 Å. Next, an SiN layer 3 is formed on the PAD oxide layer 2 by a CVD process to have a thickness of about 500 Å to 5000 Å.

Figure 5B:
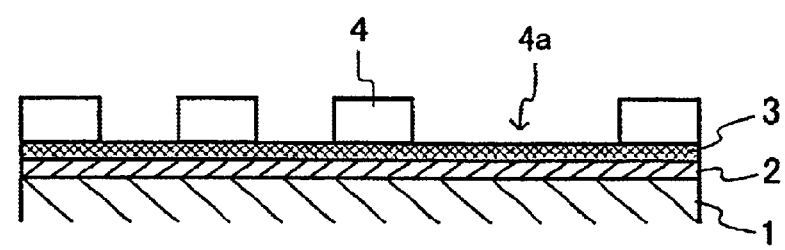

Subsequently, a resist layer is formed on the SiN layer 3 and is patterned to have openings 4a corresponding to device isolating regions, as shown in FIG. 5B.

Figure 5C:
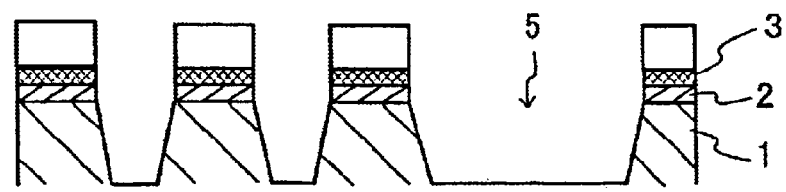
Figure 5D:
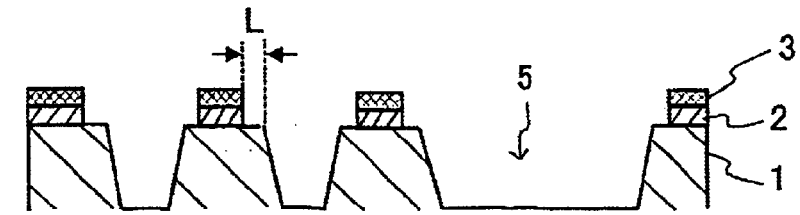

Now referring to FIG. 5C, the PAD oxide layer 2 and SiN layer 3 are plasma-etched by a conventional method with an etching gas of HBr using the resist pattern 4 as an etching mask to form trench regions 5. The first etching process is carried out under the following condition:

(1) Gas Flow Rate: $HBr/O_2$=90/5 sccm
(2) Electric Power to Upper Electrode/Lower Electrode: 600 W/66 W
(3) Pressure: 5 mTorr
(4) Etching Time: 85 sec After that, an isotropic etching is carried out to the SiN layer 3 by a chemical reaction type of etching using $H_3PO_4$ or downstream type of plasma etching so that the openings 4a are enlarged or expanded outwardly from the trench regions 5, as shown in FIG. 5D. Preferably, the SiN layer 3 is chemically etched using $H_3PO_4$ to reduce etching damage to the silicon substrate 1. The chemical etching may be carried out using $H_3PO_4$ at 160° C. for about 10 minutes.

The trench regions 5 are formed to have a depth of about 2500 Å to 5000 Å. Each of the trench regions 5 is shaped to have a wider bottom and narrower top. Shaping the trench regions in that way makes an oxide 6 layer go into the bottom of the trench region 5 easily.

Figure 5E:
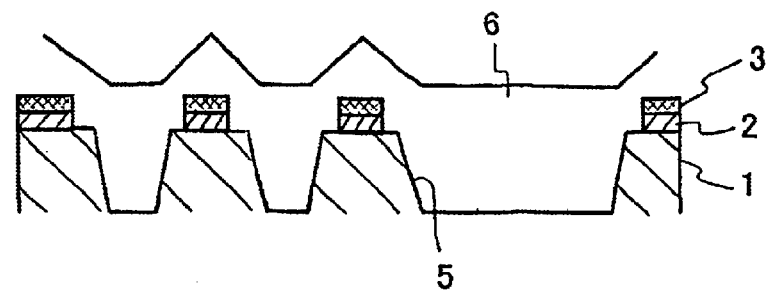

Next, as shown in FIG. 5E, the embedded oxide layer 6 is formed over the entire surface of the substrate 1 by a CVD process using high-density plasma. The trench regions 5 are filled up with the oxide layer 6.

Figure 5F:
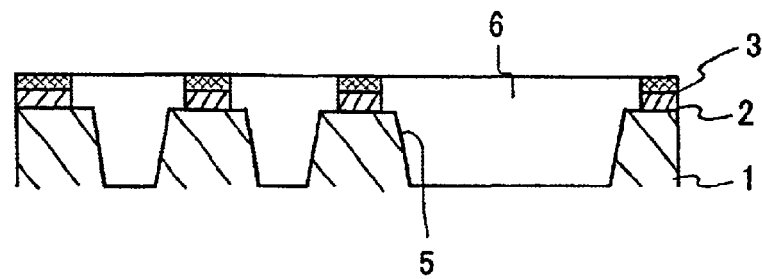

Subsequently, the oxide layer 6 is polished by a CMP process to the surface level of the SiN layer 3, as shown in FIG. 5F. After that, the SiN layer 3 and PAD oxide layer 2 are removed to form device isolating regions, as shown in FIG. 5G.

Figure 5G:
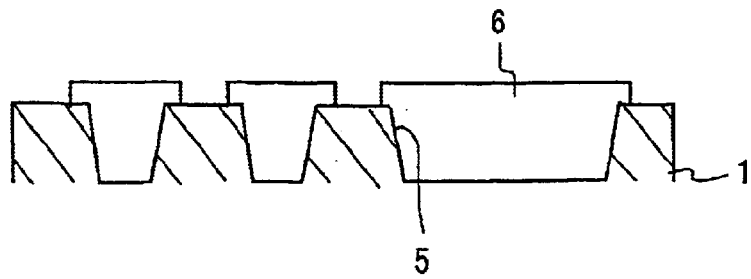

The openings defined by the SiN layer 3 and PAD oxide layer 2 are enlarged, so that the oxide layer 6 completely cover all the corners (upper edges) of the trench regions 5, as shown in FIG. 5G. In other words, the oxide layer 6 is formed to extend outwardly from the trench regions 5 onto active regions surrounding the trench regions 5 on the semiconductor substrate 1. The portions extended on the active regions prevent that upper edges (corners) of the trench regions 5 are exposed when the SiN layer 3 and PAD oxide layer 2 are removed.

Preferably, the openings defined by the SiN layer 3 are enlarged or expanded by a length of L, 300 Å to 500 Å, and the oxide layer 6 is formed to have a thickness of 300 Å to 500 Å in order to protect the upper edges of the trench regions 5. If the oxide layer 6 has a thickness less than 300 Å, the oxide layer 6 might be undesirably removed at the upper edges of the trench regions 5 when the SiN layer 3 and PAD oxide layer 2 are removed; and as a result, the upper edges of the trench regions 5 would be exposed. For that reason, the openings defined by the SiN layer 3 are enlarged or expanded by a length of L, more than 300 Å, and the oxide layer 6 is formed to have a thickness larger than 300 Å.

If the openings defined by the SiN layer 3 are enlarged by a length or width more than 500 Å, the width of the SiN layer 3 would be too short. As a result, the oxide layer 6 may be polished too much.

As described above, according to the third preferred embodiment of the present invention, the oxide layer 6 is formed so as to cover the upper edges of the trench regions 5 completely; and therefore, reliable device characteristics can be obtained.

Fourth Preferred Embodiment

FIGS. 6A to 6H are cross-sectional views showing the fabrication steps according to a fourth preferred embodiment of the present invention. In this embodiment, the same and corresponding components to those in the above-described embodiments will be represented by the same reference numerals.

Figure 6A:
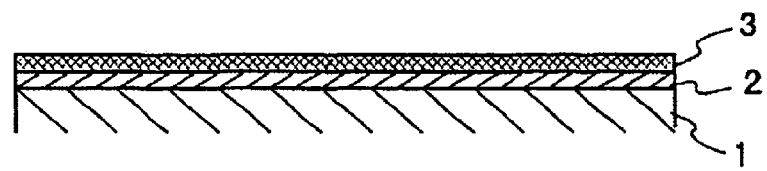
FIGS. 6A to 6H are cross-sectional views showing the fabrication steps according to a fourth preferred embodiment of the present invention.

First, referring to FIG. 6A, a PAD oxide layer 2 is formed on the semiconductor substrate 1 by a CVD process to have a thickness of about 200 Å. Next, an SiN layer 3 is formed on the PAD oxide layer 2 by a CVD process to have a thickness of about 500 Å to 5000 Å.

Figure 6B:
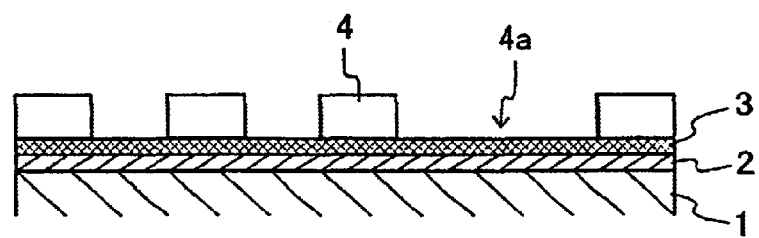

Subsequently, a resist layer is formed on the SiN layer 3 and is patterned to have openings 4a corresponding to device isolating regions, as shown in FIG. 6B.

Figure 6C:
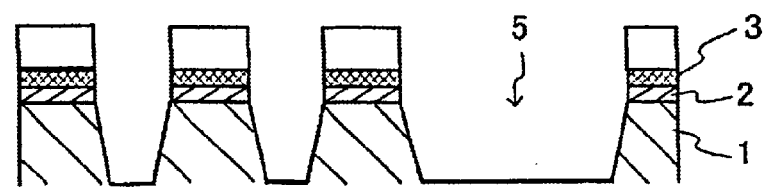
Figure 6D:
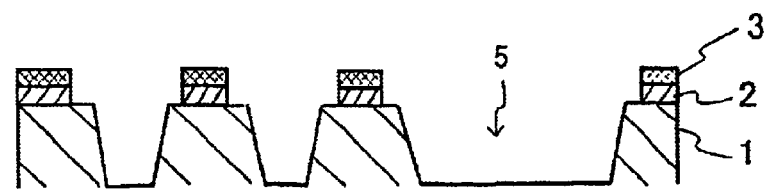

Now referring to FIG. 6C, the PAD oxide layer 2 and SiN layer 3 are plasma-etched by a conventional method with an etching gas of HBr using the resist pattern 4 as an etching mask to form trench regions 5. The first etching process is carried out under the following condition:

(1) Gas Flow Rate: $HBr/O_2=90/5$ sccm
(2) Electric Power to Upper Electrode/Lower Electrode: 600 W/66 W
(3) Pressure: 5 mTorr
(4) Etching Time: 85 sec After that, an isotropic etching is carried out to the SiN layer 3 by a chemical reaction type of etching using $H_3PO_4$ or downstream type of plasma etching so that the openings 4a are enlarged or expanded outwardly from the trench regions 5, as shown in FIG. 6D. Preferably, the SiN layer 3 is chemically etched using $H_3PO_4$ to reduce etching damage to the silicon substrate 1. The chemical etching may be carried out using $H_3PO_4$ at 160° C. for about 10 minutes.

The trench regions 5 are formed to have a depth of about 2500 Å to 5000 Å. Each of the trench regions 5 is shaped to have a wider bottom and narrower top. Shaping the trench regions in that way makes an oxide 6 layer go into the bottom of the trench region 5 easily.

Figure 6E:
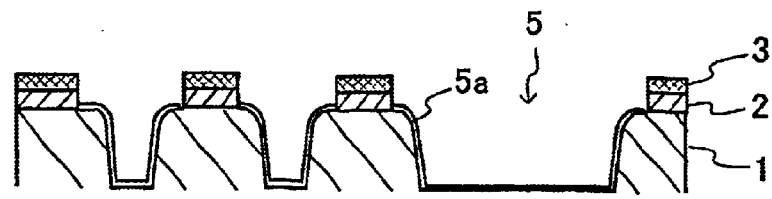

Next, a thermal oxidation treatment is carried out to the semiconductor substrate 1 to round off upper edges 5a of the trench regions 5, as shown in FIG. 6E. Such a thermal oxidation treatment is a dry type at a temperature of 1050° C. to 1100° C.

It is known that oxidation characteristics of such a thermal oxidation process not only depend on oxidation condition but also on physical stress. More precisely, oxidation speed is faster at a flat portion, where physical stress is dispersed, and is slower at a shape portion, to which physical stress is easily concentrated, such as the upper edges of the trench region. According to a conventional trench region, upper edges are covered with an SiN layer, so that the upper edges are hardly oxidized. According to this embodiment, the semiconductor substrate 1 is oxidized after the SiN layer 3 is withdrawn or retracted backwardly, so that the upper edges 5a of the trench regions 5 are rounded off easily without affection of stress of the SiN layer 3.

When such a thermal oxidation treatment is carried out, a thermal oxidation layer or coat is formed on the surface of the trench regions 5, and at the same time, the rounded-off portions 5a are formed.

Figure 6F:
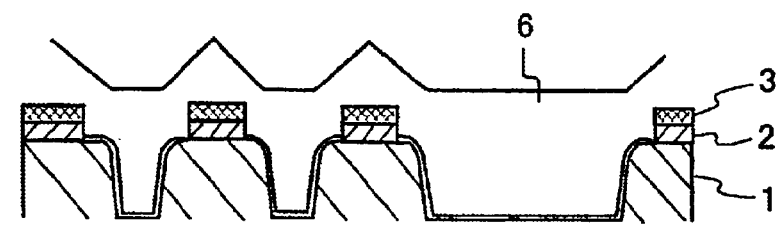

Next, as shown in FIG. 6F, the embedded oxide layer 6 is formed over the entire surface of the substrate 1 by a CVD process using high-density plasma. The trench regions 5 are filled up with the oxide layer 6.

Figure 6G:
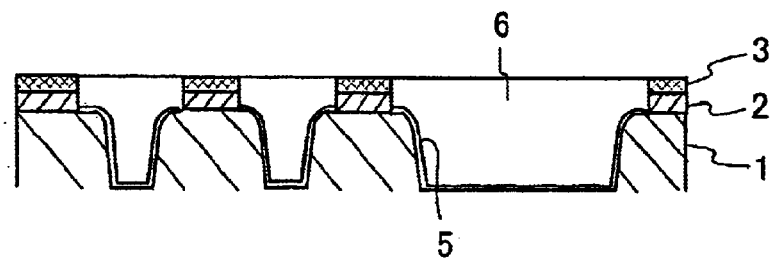

Subsequently, the oxide layer 6 is polished by a CMP process to the surface level of the SiN layer 3, as shown in FIG. 6G. After that, the SiN layer 3 and PAD oxide layer 2 are removed to form device isolating regions, as shown in FIG. 6H.

Figure 6H:
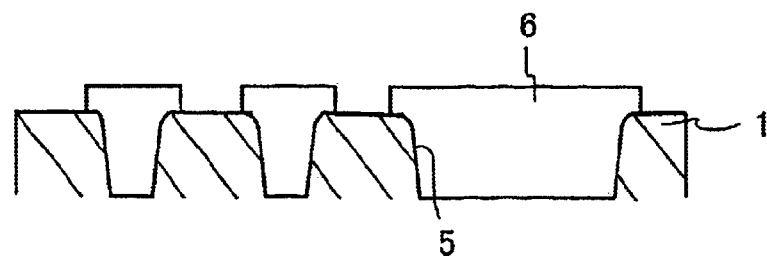

The openings defined by the SiN layer 3 and PAD oxide layer 2 are enlarged, so that the oxide layer 6 completely cover all the corners (upper edges) of the trench regions 5, as shown in FIG. 6H. In other words, the oxide layer 6 is formed to extend outwardly from the trench regions 5 onto active regions surrounding the trench regions 5 on the semiconductor substrate 1. The portions extended on the active regions prevent that upper edges (corners) of the trench regions 5 are exposed when the SiN layer 3 and PAD oxide layer 2 are removed.

As described above, according to the fourth preferred embodiment of the present invention, the oxide layer 6 is formed so as to cover the upper edges 5a of the trench regions 5 completely; and therefore, reliable device characteristics can be obtained. In addition, the upper edges 5a are rounded-off, so that concentration of electrical field at the upper edges of the trench regions can be prevented.

Fifth Preferred Embodiment

FIGS. 7A to 7H are cross-sectional views showing the fabrication steps according to a fifth preferred embodiment of the present invention. In this embodiment, the same and corresponding components to those in the above-described embodiments will be represented by the same reference numerals.

Figure 7A:
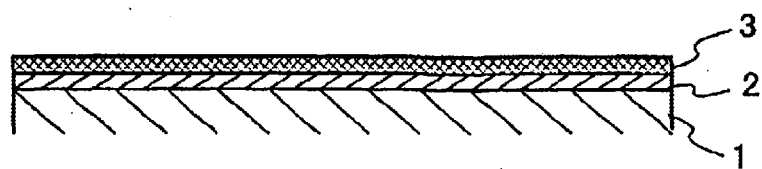
FIGS. 7A to 7H are cross-sectional views showing the fabrication steps according to a fifth preferred embodiment of the present invention.

First, referring to FIG. 7A, a PAD oxide layer 2 is formed on the semiconductor substrate 1 by a CVD process to have a thickness of about 200 Å. Next, an SiN layer 3 is formed on the PAD oxide layer 2 by a CVD process to have a thickness of about 500 Å to 5000 Å.

Figure 7B:
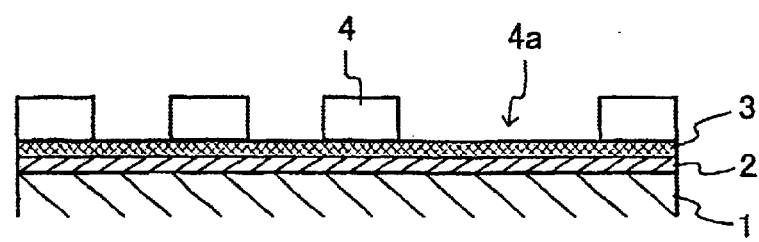

Subsequently, a resist layer is formed on the SiN layer 3 and is patterned to have openings 4a corresponding to device isolating regions, as shown in FIG. 7B.

Figure 7C:
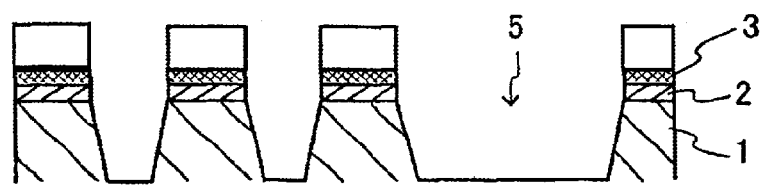
Figure 7D:
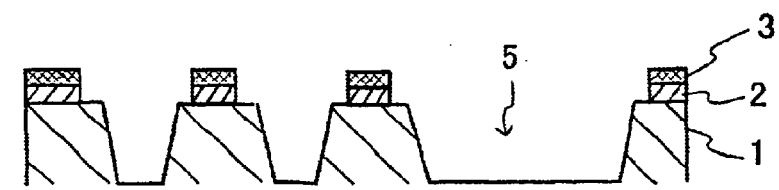

Now referring to FIG. 7C, the PAD oxide layer 2 and SiN layer 3 are plasma-etched by a conventional method with an etching gas of HBr using the resist pattern 4 as an etching mask to form trench regions 5. The first etching process is carried out under the following condition:

(1) Gas Flow Rate: $HBr/O_2=90/5$ sccm
(2) Electric Power to Upper Electrode/Lower Electrode: 600 W/66 W
(3) Pressure: 5 mTorr
(4) Etching Time: 85 sec After that, an isotropic etching is carried out to the SiN layer 3 by a chemical reaction type of etching using $H_3PO_4$ or downstream type of plasma etching so that the openings 4a are enlarged or expanded outwardly from the trench regions 5, as shown in FIG. 7D. Preferably, the SiN layer 3 is chemically etched using $H_3PO_4$ to reduce etching damage to the silicon substrate 1. The chemical etching may be carried out using $H_3PO_4$ at 160° C. for about 10 minutes.

The trench regions 5 are formed to have a depth of about 2500 Å to 5000 Å. Each of the trench regions 5 is shaped to have a wider bottom and narrower top. Shaping the trench regions in that way makes an oxide 6 layer go into the bottom of the trench region 5 easily.

Figure 7E:
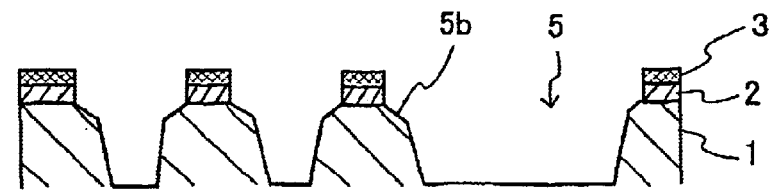
Figure 7E:
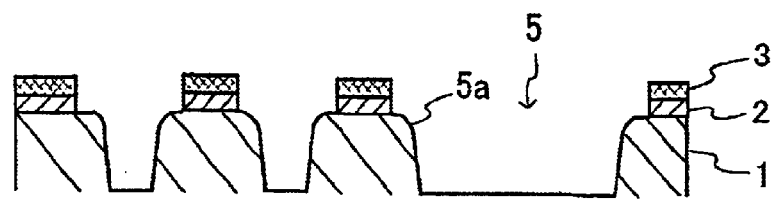

Next, another trench etching process is carried out to the semiconductor substrate 1. Upper corners of the trench regions 5 are exposed, so that the corners are tapered 5b, as shown in FIG. 7E. That is because, etching speed is faster at the corners due to concentration of electric field.

Next, a thermal oxidation treatment is carried out to the semiconductor substrate 1 to round off the tapered edges 5b of the trench regions 5, as shown in FIG. 7E, so that rounded-off edges 5a are formed. Such a thermal oxidation treatment is a dry type at a temperature of 1050° C. to 1100° C. The rounded-off edges 5a are a little gentler or looser as compared to those in the fourth preferred embodiment.

Figure 7F:
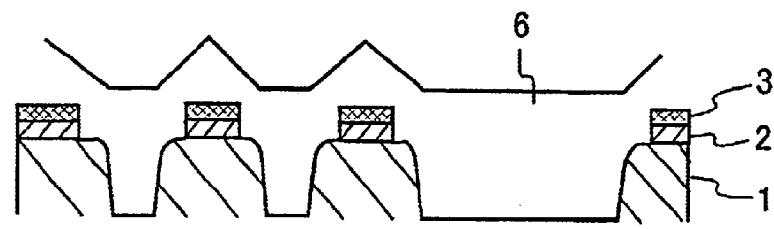

Next, as shown in FIG. 7F, the embedded oxide layer 6 is formed over the entire surface of the substrate 1 by a CVD process using high-density plasma. The trench regions 5 are filled up with the oxide layer 6.

Figure 7G:
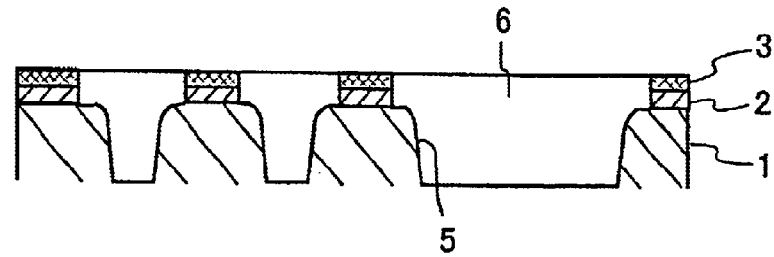

Subsequently, the oxide layer 6 is polished by a CMP process to the surface level of the SiN layer 3, as shown in FIG. 7G. After that, the SiN layer 3 and PAD oxide layer 2 are removed to form device isolating regions, as shown in FIG. 7H.

Figure 7H:
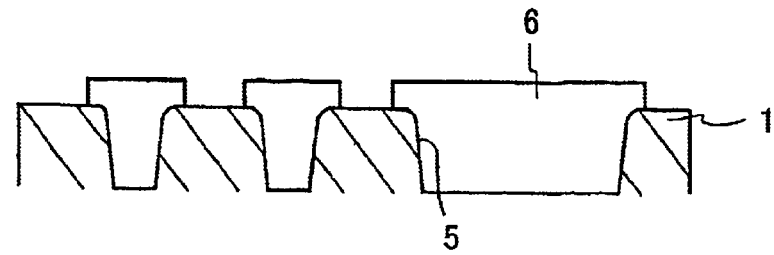

The openings defined by the SiN layer 3 and PAD oxide layer 2 are enlarged, so that the oxide layer 6 completely cover all the corners (upper edges) of the trench regions 5, as shown in FIG. 7H. In other words, the oxide layer 6 is formed to extend outwardly from the trench regions 5 onto active regions surrounding the trench regions 5 on the semiconductor substrate 1. The portions extended on the active regions prevent that upper edges (corners) of the trench regions 5 are exposed when the SiN layer 3 and PAD oxide layer 2 are removed.

As described above, according to the fifth preferred embodiment of the present invention, the oxide layer 6 is formed so as to cover the upper edges 5a of the trench regions 5 completely; and therefore, reliable device characteristics can be obtained. In addition, the upper edges 5a are rounded-off, so that concentration of electrical field at the upper edges of the trench regions 5 can be prevented.

Sixth Preferred Embodiment

FIGS. 8A to 8J are cross-sectional views showing the fabrication steps according to a sixth preferred embodiment of the present invention. In this embodiment, the same and corresponding components to those in the above-described embodiments will be represented by the same reference numerals.

Figure 8A:
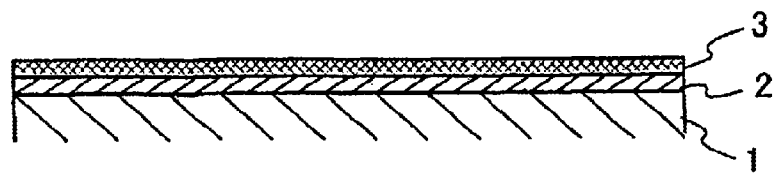
FIGS. 8A to 8J are cross-sectional views showing the fabrication steps according to a sixth preferred embodiment of the present invention.

First, referring to FIG. 8A, a PAD oxide layer 2 is formed on the semiconductor substrate 1 by a CVD process to have a thickness of about 200 Å. Next, an SiN layer 3 is formed on the PAD oxide layer 2 by a CVD process to have a thickness of about 500 Å to 5000 Å.

Figure 8B:
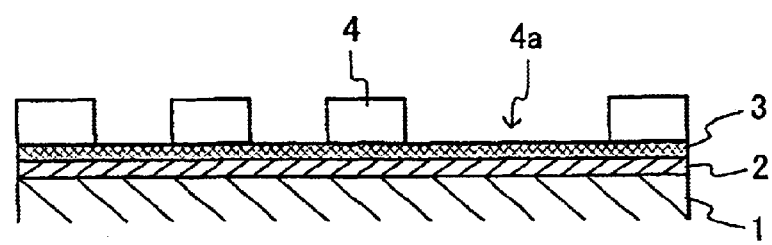

Subsequently, a resist layer is formed on the SiN layer 3 and is patterned to have openings 4a corresponding to device isolating regions, as shown in FIG. 8B.

Figure 8C:
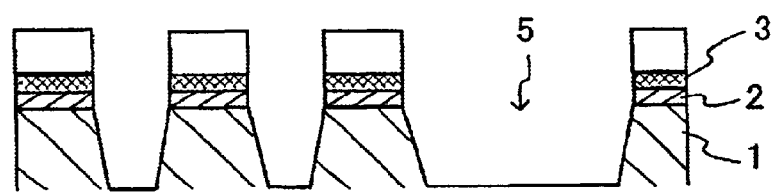
Figure 8D:
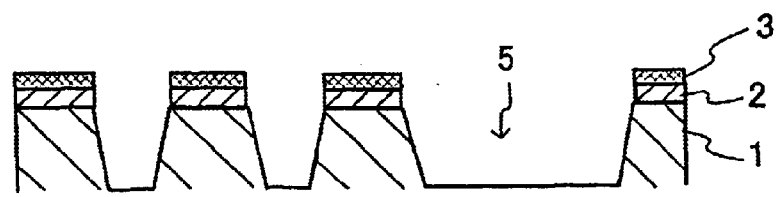

Now referring to FIG. 8C, the PAD oxide layer 2 and SiN layer 3 are plasma-etched by a conventional method with an etching gas of HBr using the resist pattern 4 as an etching mask to form trench regions 5. The first etching process is carried out under the following condition:

(1) Gas Flow Rate: $HBr/O_2 = 90/5$ sccm
(2) Electric Power to Upper Electrode/Lower Electrode: 600 W/66 W
(3) Pressure: 5 mTorr
(4) Etching Time: 85 sec After that, an isotropic etching is carried out to the SIN layer 3 by a chemical reaction type of etching using $H_3PO_4$ or downstream type of plasma etching so that the openings 4a are enlarged or expanded outwardly from the trench regions 5, as shown in FIG. 8D. Preferably, the SiN layer 3 is chemically etched using $H_3PO_4$ to reduce etching damage to the silicon substrate 1. The chemical etching may be carried out using $H_3PO_4$ at 160° C. for about 10 minutes. The resist pattern 4 is then removed.

The trench regions 5 are formed to have a depth of about 2500 Å to 5000 Å. Each of the trench regions 5 is shaped to have a wider bottom and narrower top. Shaping the trench regions in that way makes an oxide 6 layer go into the bottom of the trench region 5 easily.

Figure 8E:
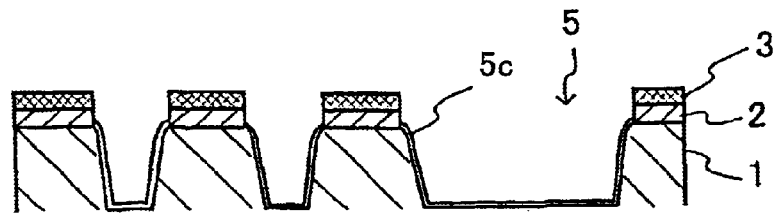

Next, a first thermal oxidation treatment is carried out to the semiconductor substrate 1 to round off upper edges 5a of the trench regions 5, as shown in FIG. 8E. Such a thermal oxidation treatment is a dry type at a temperature of 1050° C. to 1100° C.

Figure 8F:
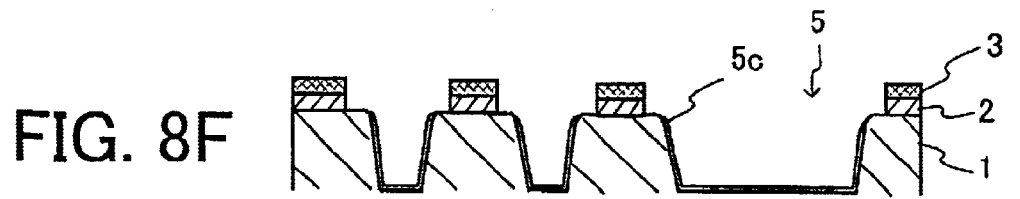

After that, an isotropic etching is carried out to the SiN layer 3 by a chemical reaction type of etching using $H_3PO_4$ so that the openings 4a are enlarged or expanded outwardly from the trench regions 5, as shown in FIG. 8F. When the first thermal oxidation treatment, a thin oxide layer is formed on the surface of the silicon substrate 1, so that the inner surface of the trench regions 5 are not exposed to $H_3PO_4$ directly.

Figure 8G:
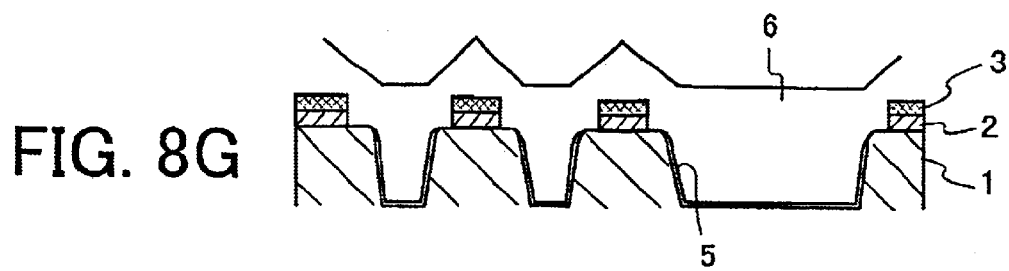

Next, as shown in FIG. 8G, the embedded oxide layer 6 is formed over the entire surface of the substrate 1 by a CVD process using high-density plasma. The trench regions 5 are filled up with the oxide layer 6. Preferably, the oxide layer 6 is of porous structure or a layer containing water or moisture.

Figure 8H:
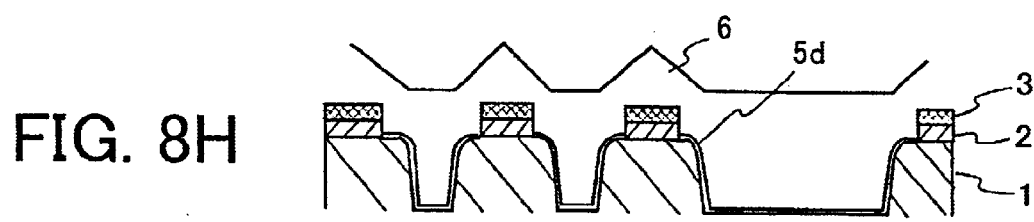

After that, a second thermal oxidation process is carried out to the silicon substrate 1 to further round off the upper edges 5a of the trench regions 5, as shown in FIG. 8H. Preferably, the second thermal oxidation is of wet manner, in which oxidation speed is faster, rather than dry manner, in which oxidation speed is slower. Although, the upper edges 5a of the trench regions are covered with a CVD oxide layer, round-off effect to the upper edges 5a can forward, because the physical stress of the CVD oxide layer is lower than that of the SiN layer 3. The oxide layer is preferably of porous structure to obtain sufficient round-off effect. The oxide layer 6 becomes to have a higher density in the second thermal oxidation process.

Figure 8I:
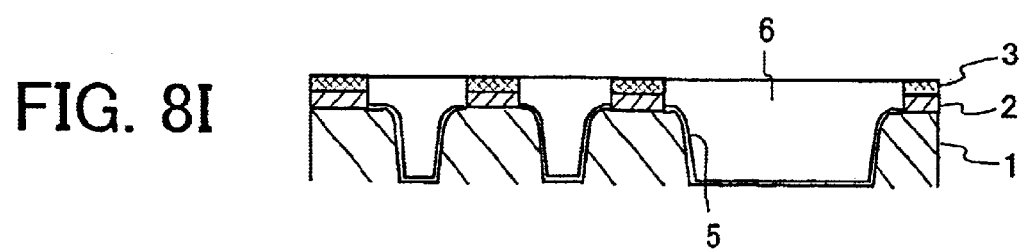

Subsequently, the oxide layer 6 is polished by a CMP process to the surface level of the SiN layer 3, as shown in FIG. 8I. After that, the SiN layer 3 and PAD oxide layer 2 are removed to form device isolating regions, as shown in FIG. 8J.

Figure 8J:
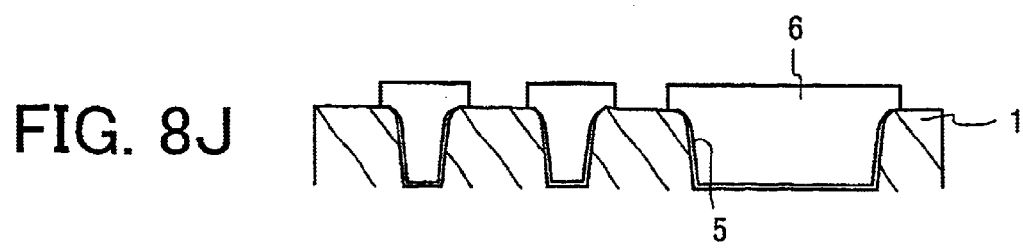

The openings defined by the SiN layer 3 and PAD oxide layer 2 are enlarged, so that the oxide layer 6 completely cover all the corners (upper edges) of the trench regions 5, as shown in FIG. 8J. In other words, the oxide layer 6 is formed to extend outwardly from the trench regions 5 onto active regions surrounding the trench regions 5 on the semiconductor substrate 1. The portions extended on the active regions prevent that upper edges (corners) of the trench regions 5 are exposed when the SiN layer 3 and PAD oxide layer 2 are removed.

As described above, according to the sixth preferred embodiment of the present invention, the oxide layer 6 is formed so as to cover the upper edges 5a of the trench regions 5 completely; and therefore, reliable device characteristics can be obtained. In addition, the upper edges 5a are rounded-off, so that concentration of electrical field at the upper edges of the trench regions can be prevented. Further, the silicon substrate 1 is not exposed to $H_3PO_4$, so that stable and reliable device characteristics can be obtained.

What is claimed is:

1. A method for fabricating a semiconductor apparatus, comprising:

providing a substrate on which a plurality of semiconductor devices are formed;

providing a mask layer on the substrate to have an opening corresponding to a device isolating region;

performing a first etching treatment to the substrate using the mask layer as an etching mask to form a trench region on the substrate;

performing a first thermal oxidation treatment of a dry type to the substrate to round off an upper edge of the trench region;

enlarging the opening of the mask layer by an isotropic etching process so that an upper edge of the trench region is fully exposed;

forming an insulating layer in the trench region and on the substrate so that the insulating layer extends outwardly from the trench region to cover the exposed upper edge of the trench region completely; and performing a second thermal oxidation treatment of a wet type to the substrate so as to further round off the upper edge of the trench region, after said forming an insulating layer.

2. The method according to claim 1, wherein the first thermal oxidation treatment is performed at a temperature of 1050° C. to 1100° C.

3. The method according to claim 1, wherein the isotropic etching process is performed by using $H_3PO_4$.

4. The method according to claim 1, wherein the insulating layer is an oxide layer formed by a CVD (Chemical Vapor Deposition) technique.

* * * * *